United States Patent
Curley et al.

(10) Patent No.: US 10,611,958 B2
(45) Date of Patent: Apr. 7, 2020

(54) INP QUANTUM DOTS WITH GAP AND ALP SHELLS AND METHODS OF PRODUCING THE SAME

(71) Applicant: Nanosys, Inc., Milpitas, CA (US)

(72) Inventors: John J. Curley, San Francisco, CA (US); Chunming Wang, Milpitas, CA (US)

(73) Assignee: Nanosys, Inc., Milpitas, CA (US)

( * ) Notice: Subject to any disclaimer, the term of this patent is extended or adjusted under 35 U.S.C. 154(b) by 0 days.

(21) Appl. No.: 16/023,430

(22) Filed: Jun. 29, 2018

(65) Prior Publication Data
US 2018/0320068 A1 Nov. 8, 2018

Related U.S. Application Data

(63) Continuation of application No. 15/406,227, filed on Jan. 13, 2017, now Pat. No. 10,066,161.
(Continued)

(51) Int. Cl.
| | |
|---|---|
| *B82Y 20/00* | (2011.01) |
| *C09K 11/70* | (2006.01) |
| *C09K 11/02* | (2006.01) |
| *C09K 11/62* | (2006.01) |
| *H05B 33/14* | (2006.01) |
| *C09K 11/08* | (2006.01) |

(Continued)

(52) U.S. Cl.
CPC ............ *C09K 11/706* (2013.01); *C09K 11/02* (2013.01); *C09K 11/025* (2013.01); *C09K 11/0883* (2013.01); *C09K 11/62* (2013.01); *C09K 11/70* (2013.01); *C09K 11/703* (2013.01); *H01L 33/502* (2013.01); *H01L 33/58* (2013.01); *H05B 33/14* (2013.01); *B82Y 20/00* (2013.01); *B82Y 40/00* (2013.01); *Y10S 977/774* (2013.01); *Y10S 977/818* (2013.01); *Y10S 977/892* (2013.01); *Y10S 977/95* (2013.01)

(58) Field of Classification Search
CPC ............ Y10S 977/818; Y10S 977/892; Y10S 977/733; Y10S 977/774; B82Y 20/00
USPC .......................................................... 257/98
See application file for complete search history.

(56) References Cited

U.S. PATENT DOCUMENTS

| | | | |
|---|---|---|---|
| 10,066,161 B2 * | 9/2018 | Curley | ................ H01L 33/502 |
| 2011/0214488 A1 | 9/2011 | Rose et al. | |

(Continued)

FOREIGN PATENT DOCUMENTS

| | | |
|---|---|---|
| JP | 2011-252117 A | 12/2011 |
| KR | 2013-0080333 A | 7/2013 |

OTHER PUBLICATIONS

Battaglia, D. and Peng, X., "Formation of High Quality InP and InAs Nanocrystals in a Noncoordinating Solvent," *Nano Letters* 2(9):1027-1030, American Chemical Society, United States (2002).
(Continued)

*Primary Examiner* — Jami Valentine Miller
(74) *Attorney, Agent, or Firm* — Sterne, Kessler, Goldstein & Fox P.L.L.C.

(57) ABSTRACT

Disclosed are highly luminescent nanostructures, particularly highly luminescent quantum dots, comprising a nanocrystal core of InP and shell layers of GaP and AlP. The nanostructures may have an additional shell layer. Also provided are methods of preparing the nanostructures, films comprising the nanostructure and devices comprising the nanostructures.

8 Claims, 4 Drawing Sheets

Related U.S. Application Data

(60) Provisional application No. 62/280,383, filed on Jan. 19, 2016.

(51) Int. Cl.
    *H01L 33/50*     (2010.01)
    *H01L 33/58*     (2010.01)
    *B82Y 40/00*     (2011.01)

(56) References Cited

U.S. PATENT DOCUMENTS

| | | | |
|---|---|---|---|
| 2011/0227007 | A1 | 9/2011 | Kang et al. |
| 2012/0205586 | A1* | 8/2012 | Ren .................... C01B 25/08 |
| | | | 252/301.36 |
| 2014/0001405 | A1 | 1/2014 | Guo et al. |
| 2015/0041759 | A1 | 2/2015 | Kahen |
| 2015/0083969 | A1 | 3/2015 | Kim et al. |
| 2015/0315721 | A1 | 11/2015 | Zhong et al. |
| 2015/0333102 | A1 | 11/2015 | Sato |
| 2015/0338567 | A1 | 11/2015 | Stevenson et al. |
| 2015/0343084 | A1 | 12/2015 | Dilley |
| 2015/0344776 | A1 | 12/2015 | Bootman |
| 2015/0351691 | A1 | 12/2015 | Lieber et al. |
| 2016/0218252 | A1 | 7/2016 | Steckel et al. |
| 2017/0058199 | A1* | 3/2017 | Jang .................... H01L 27/322 |
| 2017/0204326 | A1* | 7/2017 | Curley ................ H01L 33/502 |
| 2018/0059485 | A1* | 3/2018 | Nam .................. H01L 51/0097 |

OTHER PUBLICATIONS

Borchert, H., et al., "Investigation of ZnS Passivated InP Nanocrystals by XPS," *Nano Letters* 2(2):151-154, American Chemical Society, United States (2002).

Cros-Gagneux, A., et al., "Surface Chemistry of InP Quantum Dots: A Comprehensive Study," *J. Am. Chem. Soc.* 132:18147-18157, American Chemical Society, United States (2010).

Guzelian, A.A., et al., "Synthesis of Size-Selected, Surface-Passivated InP Nanocrystals," *J. Phys. Chem. 100*:7212-7219, American Chemical Society, United States (1996).

Haubold, S., et al., "Strongly Luminescent InP/ZnS Core-Shell Nanoparticles," *ChemPhysChem* 2(5):331-334, Wiley-VCH Verlag GmbH, Germany (2001).

Hussain, S., et al., "One-Pot Fabrication of High-Quality InP/ZnS (Core/Shell) Quantum Dots and Their Application to Cellular Imaging," *ChemPhysChem 10*:1466-1470, Wiley-VCH Verlag GmbH & Co., Germany (2009).

Jo, J.-H., et al., "Photostability enhancement of InP/ZnS quantum dots enabled by $In_2O_3$ overcoating," *Journal of Alloys and Compounds 647*:6-13, Elsevier B.V., Netherlands (2015).

Kim, S., et al., "Highly Luminescent InP/GaP/ZnS Nanocrystals and Their Application to White Light-Emitting Diodes," *Journal of the American Chemical Society* 134:3804-3809, American Chemical Society, United States (2012).

Li, J.J., et al., "Large-Scale Synthesis of Nearly Monodisperse CdSe/CdS Core/Shell Nanocrystals Using Air-Stable Reagents via Successive Ion Layer Adsorption and Reaction," *J. Am. Chem. Soc. 125*:12567-12575, American Chemical Society, United States (2003).

Li, L., et al., "Economic Synthesis of High Quality InP Nanocrystals Using Calcium Phosphide as the Phosphorus Precursor," *Chem. Mater. 20*:2621-2623, American Chemical Society, United States (2008).

Li, L. and Reiss, P., "One-pot Synthesis of Highly Luminescent InP/ZnS Nanocrystals without Precursor Injection," *J. Am. Chem. Soc. 130*:11588-11589, American Chemical Society (2008).

Lim, J., et al.,"InP@ZnSeS, Core@Composition Gradient Shell Quantum Dots with Enhanced Stability," *Chem. Mater. 23*:4459-4463, American Chemical Society, United States (2011).

Liu, Z., et al.,"Coreduction Colloidal Synthesis of III-V Nanocrystals: The Case of InP**," *Angew. Chem. Int. Ed. 47*:3540-3542, Wiley-VCH Verlag GmbH & Co., Germany (2008).

Lucey, D.W., et al., "Monodispersed InP Quantum Dots Prepared by Colloidal Chemistry in a Noncoordinating Solvent," *Chem. Mater. 17*:3754-3762, American Chemical Society, United States (2005).

Mićić, O.I., et al., "Synthesis and Characterization of InP, GaP, and $GaInP_2$ Quantum Dots," *J. Phys. Chem. 99*:7754-7759, American Chemical Society, United States (1995).

Mićić, O.I., et al., "Size-Dependent Spectroscopy of InP Quantum Dots," *J. Phys. Chem. B. 101*:4904-4912, American Chemical Society, United States (1997).

Mićić, O.I., et al., "Core-Shell Quantum Dots of Lattice-Matched $ZnCdSe_2$ Shells on InP Cores: Experiment and Theory," *J. Phys. Chem. B 104*:12149-12156, American Chemical Society, United States (2000).

Nann, T., et al., "Water Splitting by Visible Light: A Nanophotocathode for Hydrogen Production," *Angew. Chem. Int. Ed. 49*:1574-1577, Wiley-VCH Verlag GmbH & Co., Germany (2010).

Park, J.P., et al., "Highly luminescent InP/GaP/ZnS QDs emitting in the entire color range via a heating up process," *Sci Rep 6*:30094, 6 pages, Nature Publishing Group, England (2016).

Smith, A.M. and Nie, S., "Semiconductor Nanocrystals: Structure, Properties, and Band Gap Engineering," *Acc Chem Res 43*(2):190-200, American Chemical Society, United States (2010).

Wang, A., et al., "Bright, efficient, and color-stable violet ZnSe-based quantum dot light-emitting diodes," *Nanoscale 7*:2951-2959, The Royal Society of Chemistry, United Kingdom (2015).

Xie, R., et al., "Colloidal InP Nanocrystals as Efficient Emitters Covering Blue to Near-Infrared," *J. Am. Chem. Soc. 129*:15432-15433, American Chemical Society, United States (2007).

Xu, S., et al., "Rapid Synthesis of High-Quality InP Nanocrystals," *J. Am. Chem. Soc. 128*:1054-1055, American Chemical Society, United States (2006).

Zan, F., et al., "Experimental Studies on Blinking Behavior of Single InP/ZnS Quantum Dots: Effects of Synthetic Conditions and UV Irradiation," *J. Phys. Chem. C 116*:3944-3950, American Chemical Society, United States (2012).

Ziegler, J., et al., "Silica-Coated InP/ZnS Nanocrystals as Converter Material in White LEDs**," *Adv. Mater. 20*:4068-4073, Wiley-VCH Verlag GmbH & Co., Germany (2008).

International Search Report for International Application No. PCT/US2017/013471, European Patent Office, Netherlands, dated Apr. 24, 2017, 4 pages.

Unverified English language translation of Japanese Patent Publication No. JP 2011-252117 A, published Dec. 15, 2011 (listed on the accompanying form PTO/SB/O8A as document FP1).

DWPI Patent Abstracts, English language abstract of KR 2013-0080333 A, published Jul. 12, 2013 (listed as document FP2 on accompanying form PTO/SB/08A).

\* cited by examiner

INP QUANTUM DOTS WITH GAP AND ALP SHELLS AND METHODS OF PRODUCING THE SAME

BACKGROUND OF THE INVENTION

Field of the Invention

The invention is in the field of nanotechnology. Provided are highly luminescent nanostructures, particularly highly luminescent quantum dots, comprising a nanocrystal core of InP and shell layers of GaP and AlP. The nanostructures may have an additional shell layer. Also provided are methods of preparing the nanostructures, films comprising the nanostructure and devices comprising the nanostructures.

Background Art

Semiconductor nanostructures can be incorporated into a variety of electronic and optical devices. The electrical and optical properties of such nanostructures vary, e.g., depending on their composition, shape, and size. For example, size-tunable properties of semiconductor nanoparticles are of great interest for applications such as light emitting diodes (LEDs), lasers, and biomedical labeling. Highly luminescent nanostructures are particularly desirable for such applications.

To exploit the full potential of nanostructures in applications such as LEDs and displays, the nanostructures need to simultaneously meet five criteria: narrow and symmetric emission spectra, high photoluminescence (PL) quantum yields (QYs), high optical stability, eco-friendly materials, and low-cost methods for mass production. Most previous studies on highly emissive and color-tunable quantum dots have concentrated on materials containing cadmium, mercury, or lead. Wang, A., et al., *Nanoscale* 7:2951-2959 (2015). But, there are increasing concerns that toxic materials such as cadmium, mercury, or lead would pose serious threats to human health and the environment and the European Union's Restriction of Hazardous Substances rules ban any consumer electronics containing more than trace amounts of these materials. Therefore, there is a need to produce materials that are free of cadmium, mercury, and lead for the production of LEDs and displays.

Cadmium-free quantum dots based on indium phosphide are thought to be inherently less stable than the prototypic cadmium selenide quantum dots. The higher valence and conduction band energy levels make InP quantum dots more susceptible to photooxidation by electron transfer from an excited quantum dot to oxygen, as well as more susceptible to photoluminescence quenching by electron-donating agents such as amines or thiols which can refill the hole states of excited quantum dots and thus suppress radiative recombination of excitons.

Inorganic shell coatings on quantum dots are a universal approach to tailoring their electronic structure. Additionally, deposition of an inorganic shell can produce more robust particles by passivation of surface defects. Ziegler, J., et al., *Adv. Mater.* 20:4068-4073 (2008). For example, shells of wider band gap semiconductor materials such as ZnS can be deposited on a core with a narrower band gap—such as CdSe or InP—to afford structures in which excitons are confined within the core. This approach increases the probability of radiative recombination and makes it possible to synthesize very efficient quantum dots with quantum yields close to unity and thin shell coatings.

Most quantum dots do not retain their originally high quantum yield after continuous exposure to excitation photons. Elaborate shelling engineering such as the formation of multiple shells and thick shells—wherein the carrier wave functions in the core become distant from the surface of the quantum dot—have been effective in mitigating the photoinduced quantum dot deterioration. Furthermore, it has been found that the photodegradation of quantum dots can be retarded by encasing them with an oxide—physically isolating the quantum dot surface from their environment. Jo, J.-H., et al., *J. Alloys Compd.* 647:6-13 (2015).

The interfaces in these heterogeneous nanostructures need to be free of defects because defects act as trap sites for charge carrier sites and result in a deterioration of both luminescence efficiency and stability. Due to the naturally different lattice spacings of these conductor materials, the crystal lattices at the interface will be strained. The energy burden of this strain is compensated by the favorable epitaxial alignment of thin layers, but for thicker layers the shell material relaxes to its natural lattice—creating misalignment and defects at the interface. There is an inherent tradeoff between adding more shell material and maintaining the quality of the material. Therefore, a need exists to find a suitable shell composition that overcomes these problems. Smith, A., et al., *Acc. Chem. Res.* 43: 190-200.

Recent advances have made it possible to obtain highly luminescent plain core nanocrystals. But, the synthesis of these plain core nanocrystals has shown stability and processability problems and it is likely that these problems may be intrinsic to plain core nanocrystals. Thus, core/shell nanocrystals are preferred when the nanocrystals must undergo complicated chemical treatments—such as for biomedical applications—or when the nanocrystals require constant excitation as with LEDs and lasers. See Li, J. J., et al. *J. Am. Chem. Soc.* 125:12567-12575 (2003).

There are two critical issues that must be considered to control the size distribution during the growth of shell materials: (1) the elimination of the homogenous nucleation of the shell materials; and (2) homogenous monolayer growth of shell precursors to all core nanocrystals in solution to yield shell layers with equal thickness around each core nanocrystal. Successive ion layer adsorption and reaction (SILAR) was originally developed for the deposition of thin films on solid substrates from solution baths and has been introduced as a technique for the growth of high-quality core/shell nanocrystals of compound semiconductors.

Kim et al., *J. Am. Chem. Soc.* 134:3804-3809 (2012) reported the preparation of highly luminescent InP/GaP/ZnS nanocrystals. The intermediate InP/GaP nanocrystals were prepared by a process comprising treating a ZnInP core with $GaCl_3$ and oleic acid that reportedly formed a gallium-oleate complex. Kim et al. reported that the resulting blue-shift that occurred could be explained by $Ga^{3+}$ replacing $In^{3+}$ ions near the surface, thus causing a reduction in the size of the InP core. However, the Supporting Information showed that the gallium incorporation was not significant (see S2 and S9). And, the Examples herein demonstrate that a reaction comprising $GaCl_3$ and oleic acid does not result in the incorporation of gallium onto an InP core. Instead, the blue-shifting is likely due to the reduction in size of the InP nanocrystals by oleic acid etching.

A need exists to find a method to prepare InP nanocrystals with GaP and AlP shells. The present invention provides methods for preparing InP/GaP and InP/AlP nanocrystals.

BRIEF SUMMARY OF THE INVENTION

The invention provides nanostructure comprising an InP core and a first GaP or AlP shell. In some embodiments, the nanostructure comprises an alloy between the InP and the first GaP or AlP shell. In other embodiments, the nanostructure further comprises a second shell surrounding the first GaP or AlP shell. In some embodiments, the second shell is selected from the group consisting of CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AlN, AlSb, AlS, PbS, PbO, PbSe, PbTe, MgO, MgS, MgSe, MgTe, CuCl, Ge, Si and alloys thereof.

In one embodiment, the invention provides a nanostructure which comprises an InP core surrounded by a first GaP shell and further surrounded by a ZnS shell.

In one embodiment, the invention provides a nanostructure which comprises an InP core surrounded by a first AlP shell and further surrounded by a ZnS shell.

The invention further provides method of making a nanostructure, comprising (a) contacting an InP core with $MX_3$, wherein M=Al or Ga, and X=an anion, and a source of phosphide in a solvent to give an InP core surrounded by a first GaP or AlP shell.

In one embodiment, the method further comprises isolating the nanostructure. In one embodiment, the source of phosphide is a (trialkylsilyl)$_3$phosphine. In one embodiment, the (trialkylsilyl)$_3$phosphine is (trimethylsilyl)$_3$phosphine. In some embodiments, the anion is $F^-$, $Cl^-$, $Br^-$, $I^-$, $OH^-$ or $OSO_2R^-$, wherein R is an alkyl or an optionally alkyl substituted aryl group. In one embodiment, the invention comprises heating the InP core surrounded by the first GaP or AlP shell to thereby form an alloy between the InP and GaP or AlP.

In one embodiment, the method further comprises forming a second shell surrounding the InP core and the first GaP or AlP shell. In one embodiment, the second shell comprises ZnS. In one embodiment, the method comprises contacting the InP core surrounded by the first GaP or AlP shell with a source of zinc and a source of sulfur in a solvent. In one embodiment, the source of zinc is a zinc dicarboxylate. In one embodiment, the zinc dicarboxylate is zinc dioleate. In some embodiments, the source of sulfur is an alkyl mercaptan. In one embodiment, the alkyl mercaptan is octane-1-thiol. In one embodiment, the solvent is trioctylphosphine.

In some embodiments, the invention provides a film comprising a matrix and a population of nanostructures described herein.

In some embodiments, the invention provides a display device comprising:
(a) a layer that emits radiation;
(b) a film layer comprising a population of nanostructures described herein, disposed on the radiation emitting layer;
(c) an optically transparent barrier layer on the film layer; and
(d) an optical element, disposed on the barrier layer.

In some embodiments, the radiation emitting layer, the film layer, and the optical element are part of a pixel unit of the display device. In one embodiment, the optical element is a color filter. In one embodiment, the barrier layer comprises an oxide. In one embodiment, the film layer further comprises surfactants or ligands bonded to the optically transparent barrier layer. In one embodiment, the optically transparent barrier layer is configured to protect the nanostructure from degradation by light flux, heat, oxygen, moisture, or a combination thereof.

BRIEF DESCRIPTION OF THE DRAWINGS

As shown in FIG. 3, Ga was not incorporated into the nanostructure.

DETAILED DESCRIPTION OF THE INVENTION

Definitions

Figure 1:
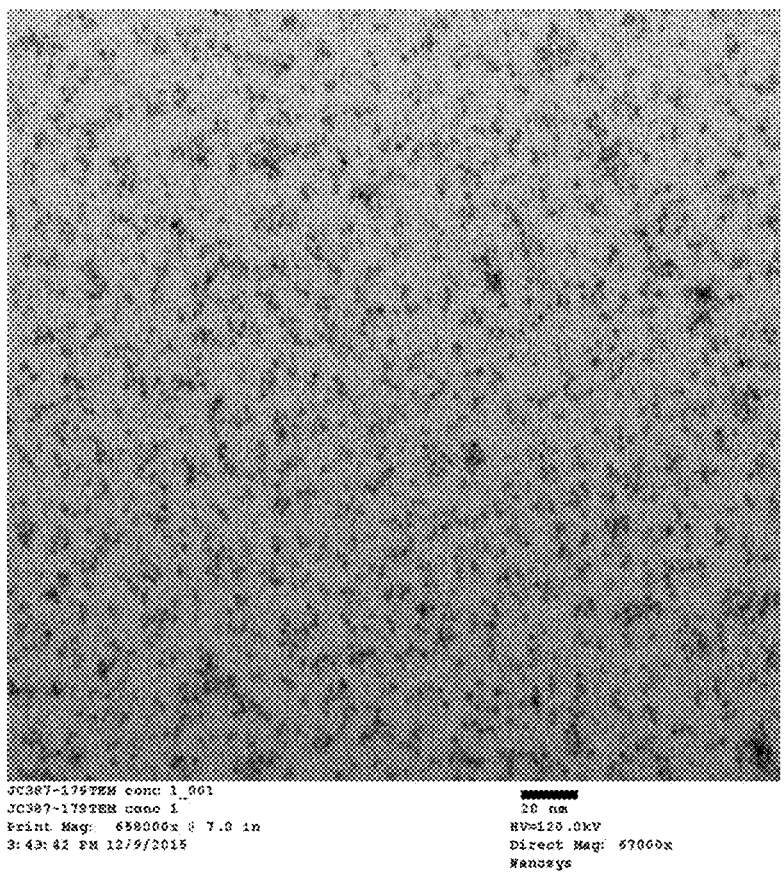
FIG. 1 is a transmission election microscopy (TEM) image of InP/GaP nanocrystals obtained according to Example 1.

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of such nanostructures, and the like.

The term "about" as used herein indicates the value of a given quantity varies by ±10% of the value, or optionally ±5% of the value, or in some embodiments, by ±1% of the value so described. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear a coating, or can be comprised of a core and at least one shell. In such instances it will be appreciated that the shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogenous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

A "ligand" is a molecule capable of interacting (whether weakly or strongly) with one or more faces of a nanostructure, e.g., through covalent, ionic, van der Waals, or other molecular interactions with the surface of the nanostructure.

"Photoluminescence quantum yield" is the ratio of photons emitted to photons absorbed, e.g., by a nanostructure or population of nanostructures. As known in the art, quantum yield is typically determined by a comparative method using well-characterized standard samples with known quantum yield values.

As used herein, the term "layer" refers to material deposited onto the core or onto previously deposited layers and that result from a single act of deposition of the core or shell material. The exact thickness of a layer is dependent on the material.

As used herein, the term "full width at half-maximum" (FWHM) is a measure of the size distribution of quantum dots. The emission spectra of quantum dots generally have the shape of a Gaussian curve. The width of the Gaussian curve is defined as the FWHM and gives an idea of the size distribution of the nanocrystals. When plotted with nanometers on the x-axis, the Gaussian curve will be asymmetric, tailing towards longer wavelengths. A smaller FWHM corresponds to a narrower quantum dot nanocrystal size distribution. FWHM is also dependent upon the emission wavelength maximum.

"Alkyl" as used herein refers to a straight or branched, saturated or unsaturated, aliphatic radical having the number of carbon atoms indicated. In some embodiments, the alkyl is $C_{1-2}$ alkyl, $C_{1-3}$ alkyl, $C_{1-4}$ alkyl, $C_{1-5}$ alkyl, $C_{1-6}$ alkyl, $C_{1-7}$ alkyl, $C_{1-8}$ alkyl, $C_{1-9}$ alkyl, $C_{1-10}$ alkyl, $C_{1-12}$ alkyl, $C_{1-14}$ alkyl, $C_{1-16}$ alkyl, $C_{1-18}$ alkyl, $C_{1-20}$ alkyl, $C_{8-20}$ alkyl, $C_{12-20}$ alkyl, $C_{14-20}$ alkyl, $C_{16-20}$ alkyl, or $C_{18-20}$ alkyl. For example, $C_{1-6}$ alkyl includes, but is not limited to, methyl, ethyl, propyl, isopropyl, butyl, isobutyl, sec-butyl, tert-butyl, pentyl, isopentyl, and hexyl. In some embodiments, the alkyl is octyl, nonyl, decyl, undecyl, dodecyl, tridecyl, tetradecyl, pentadecyl, hexadecyl, heptadecyl, octadecyl, nonadecyl, icosanyl, or oleyl.

"Aryl" as used herein refers to a $C_{6-10}$ aromatic group such as phenyl or naphthyl.

Unless clearly indicated otherwise, ranges listed herein are inclusive.

A variety of additional terms are defined or otherwise characterized herein.

Production of InP Cores

Methods for colloidal synthesis of InP nanostructures are known in the art. Such methods include techniques for controlling nanostructure growth, e.g., to control the size and/or shape distribution of the resulting nanostructures.

Synthesis of InP-based nanostructures has been described, e.g., in Xie, R., et al., "Colloidal InP nanocrystals as efficient emitters covering blue to near-infrared," *J. Am. Chem. Soc.* 129:15432-15433 (2007); Micic, O. I., et al., "Core-shell quantum dots of lattice-matched $ZnCdSe_2$ shells on InP cores: Experiment and theory," *J. Phys. Chem. B* 104:12149-12156 (2000); Liu, Z., et al., "Coreduction colloidal synthesis of III-V nanocrystals: The case of InP," *Angew. Chem. Int. Ed. Engl.* 47:3540-3542 (2008); Li, L. et al., "Economic synthesis of high quality InP nanocrystals using calcium phosphide as the phosphorus precursor," *Chem. Mater.* 20:2621-2623 (2008); D. Battaglia and X. Peng, "Formation of high quality InP and InAs nanocrystals in a noncoordinating solvent," *Nano Letters* 2:1027-1030 (2002); Kim, S., et al., "Highly luminescent InP/GaP/ZnS nanocrystals and their application to white light-emitting diodes," *J. Am. Chem. Soc.* 134:3804-3809 (2012); Nann, T., et al., "Water splitting by visible light: A nanophotocathode for hydrogen production," *Angew. Chem. Int. Ed.* 49:1574-1577 (2010); Borchert, H., et al., "Investigation of ZnS passivated InP nanocrystals by XPS," *Nano Letters* 2:151-154 (2002); L. Li and P. Reiss, "One-pot synthesis of highly luminescent InP/ZnS nanocrystals without precursor injection," *J. Am. Chem. Soc.* 130:11588-11589 (2008); Hussain, S., et al. "One-pot fabrication of high-quality InP/ZnS (core/shell) quantum dots and their application to cellular imaging," *Chemphyschem.* 10:1466-1470 (2009); Xu, S., et al., "Rapid synthesis of high-quality InP nanocrystals," *J. Am. Chem. Soc.* 128:1054-1055 (2006); Micic, O. I., et al., "Size-dependent spectroscopy of InP quantum dots," *J. Phys. Chem. B* 101:4904-4912 (1997); Haubold, S., et al., "Strongly luminescent InP/ZnS core-shell nanoparticles," *Chemphyschem.* 5:331-334 (2001); CrosGagneux, A., et al., "Surface chemistry of InP quantum dots: A comprehensive study," *J. Am. Chem. Soc.* 132:18147-18157 (2010); Micic, O. I., et al., "Synthesis and characterization of InP, GaP, and $GaInP_2$ quantum dots," *J. Phys. Chem.* 99:7754-7759 (1995); Guzelian, A. A., et al., "Synthesis of size-selected, surface-passivated InP nanocrystals," *J. Phys. Chem.* 100:7212-7219 (1996); Lucey, D. W., et al., "Monodispersed InP quantum dots prepared by colloidal chemistry in a non-coordinating solvent," *Chem. Mater.* 17:3754-3762 (2005); Lim, J., et al., "InP@ZnSeS, core@composition gradient shell quantum dots with enhanced stability," *Chem. Mater.* 23:4459-4463 (2011); and Zan, F., et al., "Experimental studies on blinking behavior of single InP/ZnS quantum dots: Effects of synthetic conditions and UV irradiation," *J. Phys. Chem. C* 116:394-3950 (2012). However, such efforts have had only limited success in producing InP nanostructures with high quantum yields.

To a round-bottomed flask equipped with two vacuum adapters and a thermocouple pass-through was added 7.00 g (28.01 mmol, 1.00 equiv) of $In(O_2C_2H_3)_2OH$, 1.80 g (8.200 mmol, 0.29 equiv) of $Zn(O_2C_2H_3)_2(H_2O)2$, 5.20 g (13.45 mmol, 048 equiv) of trioctylphosphine oxide and 14.51 g (72.44 mmol, 2.59 equiv) of lauric acid at room temperature in open air. The flask was placed under vacuum followed by addition of pressure to <150 mtorr to de-gas the sample. The flask was placed under a positive pressure of nitrogen, and warmed to 80° C. with stirring. Once the solids melted, the temperature was raised to 125° C. at which temperature the second gas adapter was opened to vent the headspace of the reaction vessel through an octadecene charged bubbler for 90 minutes. Then, the nitrogen purge was stopped and the flask was placed under dynamic vacuum for 60 minutes. The reaction mixture was quickly heated to 300° C. before a solution of 3.00 g (11.97 mmol, 0.43 equiv) of tris(trimethylsilyl)phosphine and 12.0 g (32.38 mmol, 1.16 equiv) of trioctylphosphine rapidly injected into the reaction mixture. The reaction stirred for 80 seconds then the heat was removed from the flask. The reaction vessel was allowed to cool to 20° C. under a positive pressure of nitrogen before being transferred into an inert-atmosphere glovebox. Inside the glovebox, an excess of ethanol was added to the reaction mixture to precipitate solids. The mixture was centrifuged at 4000 rpm for 10 min before the supernatant was removed. The resulting solids were dissolved in a minimal amount of hexanes and the solution filtered through a 0.45 μm PVDF filter.

The absorption and emission maximums of the InP nanostructures may be fine tuned by controlling the size of the InP nanostructures. For example, increased concentrations of InP precursors can be provided or longer reaction times can be used to obtain larger nanostructures that emit in the red region of the spectrum (610-650 nm) and green region (505-540 nm). The InP nanostructures may also be etched with acid to reduce their size so that they emit in the blue region (445-485 nm).

In some embodiments, the InP core is purified before deposition of a shell layer. In some embodiments, the core is filtered to remove precipitate from the core solution.

In some embodiments, the InP core is subjected to an acid etching step before deposition of a shell layer.

In some embodiments, the InP nanostructures are free from cadmium. As used herein, the term "free of cadmium" is intended that the nanostructures contain less than 100 ppm by weight of cadmium. The Restriction of Hazardous Substances (RoHS) compliance definition requires that there must be no more than 0.01% (100 ppm) by weight of cadmium in the raw homogeneous precursor materials. The cadmium level in the Cd-free nanostructures of the present invention is limited by the trace metal concentration in the precursor materials. The trace metal (including cadmium) concentration in the precursor materials for the Cd-free nanostructures, is measured by inductively coupled plasma techniques (ICP-MS or ICP-AES) analysis, and may be on the parts per billion (ppb) level. In some embodiments, nanostructures that are "free of cadmium" contain less than about 100 ppm, less than about 50 ppm, less than about 20 ppm, less than about 10 ppm, or less than about 1 ppm of cadmium.

Production of GaP and ALP Shell Layers on InP Cores

In some embodiments, the nanostructures of the present invention include a core and at least one GaP or AlP shell layer. In some embodiments, the nanostructures of the present invention include a core and at least two shell layers. The shell can, e.g., increase the quantum yield and/or stability of the nanostructures. In particular, a GaP or AlP shell on an InP core may serve as a lattice matching layer for a further shell such as ZnS, due to a low lattice mismatch between the GaP or AlP and ZnS.

TABLE 1

Lattice constants and lattice mismatch for ZnS and selected III-V semiconductors

|  | ZnS | AlP | GaP | InP |
|---|---|---|---|---|
| Lattice constant (Å) | 5.420 | 5.4672 | 5.4505 | 5.8697 |
| Lattice Mismatch (%) | 0.0 | 0.87 | 0.56 | 8.3 |

In some embodiments, a shell layer is deposited onto the core layer. In some embodiments, the shell layer deposited onto the core layer is a GaP or AlP shell layer.

In some embodiments, the shell layer comprises more than one layer of GaP or AlP. The number of shell layers is an average for all the nanostructures; therefore, the number of shell layers may be a fraction. In some embodiments, the number of GaP or AlP layers in the shell layer is between 0.25 and 10, between 0.25 and 8, between 0.25 and 7, between 0.25 and 6, between 0.25 and 5, between 0.25 and 4, between 0.25 and 3, between 0.25 and 2, between 2 and 10, 2 and 8, between 2 and 7, between 2 and 6, between 2 and 5, between 2 and 4, between 2 and 3, between 3 and 10, between 3 and 8, between 3 and 7, between 3 and 6, between 3 and 5, between 3 and 4, between 4 and 10, between 4 and 8, between 4 and 7, between 4 and 6, between 4 and 5, between 5 and 10, between 5 and 8, between 5 and 7, between 5 and 6, between 6 and 10, between 6 and 8, between 6 and 7, between 7 and 10, between 7 and 8, or between 8 and 10. In some embodiments, the shell layer comprises between 3 and 4 layers of GaP or AlP.

The thickness of the GaP or AlP shell layer can be controlled by varying the amount of precursor provided and/or by use of longer reaction times and/or higher temperatures. For a given layer, at least one of the precursors is optionally provided in an amount whereby, when a growth reaction is substantially complete, a layer of a predetermined thickness is obtained. If more than one different precursor is provided, either the amount of each precursor can be limited or one of the precursors can be provided in a limiting amount while the others are provided in excess.

The thickness of the shell layer can be determined using techniques known to those of skill in the art. In one embodiment, the thickness of each layer is determined by comparing the diameter of the core before and after the addition of each layer. In one embodiment, the diameter of the core before and after the addition of each layer is determined by transmission electron microscopy. In some embodiments, each GaP or AlP layer has a thickness of between 0.05 nm and 2 nm, between 0.05 nm and 1 nm, between 0.05 nm and 0.5 nm, between 0.05 nm and 0.3 nm, between 0.05 nm and 0.1 nm, between 0.1 nm and 2 nm, between 0.1 nm and 1 nm, between 0.1 nm and 0.5 nm, between 0.1 nm and 0.3 nm, between 0.3 nm and 2 nm, between 0.3 nm and 1 nm, between 0.3 nm and 0.5 nm, between 0.5 nm and 2 nm, between 0.05 nm and 1 nm, or between 1 nm and 2 nm.

In one embodiment, the shell is obtained by contacting an InP core with $MX_3$, wherein M=Al or Ga, and X=an anion, and a source of phosphide in a solvent to give an InP core surrounded by a first GaP or AlP shell. In one embodiment, the reaction is carried out in the absence of acid that may cause etching of the InP core.

In one embodiment, the source of phosphide is a (trialkylsilyl)$_3$phosphine. One example of a (trialkylsilyl)$_3$phosphine is (trimethylsilyl)$_3$phosphine.

In one embodiment, the anion is $F^-$, $Cl^-$, $Br^-$, $I^-$, $OH^-$ or $OSO_2R^-$, wherein R is an alkyl or an optionally alkyl substituted aryl group (e.g., phenyl or o-, or p-tolyl).

In one embodiment, the solvent is trioctylphosphine (TOP), which also functions as a ligand for the nanostructure. In another embodiment, the solvent is selected from the group consisting of 1-octadecene, 1-hexadecene, 1-eicosene, eicosane, octadecane, hexadecane, tetradecane, squalene, trioctylphosphine oxide, and dioctyl ether. In some embodiments, the solvent is 1-octadecene. In another embodiment, the solvent is an amine such as one selected from the group consisting of dodecylamine, oleylamine, hexadecylamine, and octadecylamine.

The reaction may be carried out at a temperature between 100 to 325° C., preferably between 110 to 200° C. In one embodiment, the reaction temperature is maintained at about 120° C. The reaction time may range between 1 min to 2 hours, preferably between 5 and 60 min. In one embodiment, the reaction is held at about 120° C. for about one hour before cooling to room temperature.

Scheme 1 depicts a reaction for the preparation of a GaP or AlP shell on an InP core and a further reaction to deposit a ZnS shell:

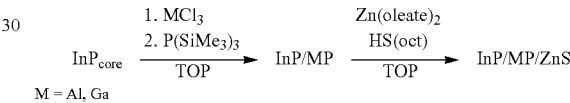

M = Al, Ga

It was found that $MCl_3$ (M=Al or Ga) may be dissolved in TOP at 20° C. The addition of InP nanocrystals to $MCl_3$ in TOP resulted in a red-shift of the absorption spectrum (FIG. 1 and Table 2). For M=Ga, the experiment was stopped after this step and inductively coupled plasma atomic emission spectroscopy (ICP-AES) showed that Ga had been incorporated into the nanocrystal, consistent with an InP/GaP structure (Table 3). In a second step, P(SiMe$_3$)$_3$ was added to the mixture of $MCl_3$ and InP core resulting in additional growth of a GaP shell; however, no change was affected for Al-containing sample. Finally, a mixture of Zn(oleate)$_2$ and octanethiol were added to the reaction mixture that was then heated to 310° C. to form an outer ZnS shell. Samples were not strongly emissive at 20° C. until after the ZnS shell was formed.

TABLE 2

Shifts in the excitonic peak absorbance during each step in the reaction sequence forming InP/MP/ZnS quantum dots (M = Ga, Al).

| Reaction Step | Ga$^{3+}$ | Reaction Step | Al$^{3+}$ |
|---|---|---|---|
| InP core | 475 | InP core | 475 |
| InP + MCl$_3$, 120° C. | 480 | InP + MCl$_3$, 110° C. | 489 |
| 150° C. | 480 | 150° C. | 489 |
| 200° C. | 485 | +P(SiMe$_3$)$_3$ | 487 |
| +P(SiMe$_3$)$_3$ | 499 | +"ZnS" | 505 |
| +"ZnS" | 502 |  |  |
| $\Phi_{PL}$ (%) of isolated material | 66 | $\Phi_{PL}$ (%) of isolated material | 55 |

The successful incorporation of Al and Ga into InP nanocrystals is supported by UV-vis spectroscopy and ICP- AES measurements. For both Al and Ga, the red-shift in the optical absorbance spectrum is consistent with the growth of the quantum dot upon treatment with $MX_3$. ICP-AES data were acquired on precipitated nanocrystals after removing soluble species. These data show the presence of Ga and Al only in samples where each element is proposed to be incorporated into an InP/MP/ZnS, core-shell-shell quantum dot (Table 3).

TABLE 3

Mole fraction of each element as measured by ICP-AES

| Example | Sample | In | Al | Ga | P | Zn | S |
|---|---|---|---|---|---|---|---|
| 1 | InP/GaP | 1.000 | ND | 0.255 | 1.057 | 0.020 | 0.00 |
| 2 | InP/GaP | 1.000 | ND | 0.189 | 0.947 | 0.035 | ND |
| 3 | InP/GaP/ZnS | 1.000 | ND | 0.297 | 1.064 | 9.147 | 7.068 |
| 5 | InP/AlP/ZnS | 1.000 | 0.158 | ND | 1.057 | 8.429 | 7.235 |

NM = not measured;
ND = not detected

The InP/MP nanostructure may be isolated according to methods known in the art. For example, the nanostructure may be precipitated from the solution by addition of an organic solvent, e.g., a polar solvent such as acetone or an alcohol such as methanol. The precipitated solid may then be washed with the polar solvent, then taken up in a non-polar solvent such as hexane, and reprecipitated with a polar solvent. This process may be repeated. The nanostructure may further be isolated by filtration and washed with a polar solvent.

In one embodiment, the InP core surrounded by the first GaP or AlP shell may be heated to cause migration of the Ga- or Al-shell into the InP core to thereby form in an alloy $In_xGa_{1-x}P$ or $In_xAl_{1-x}P$. The temperature of this heating step may range from 100 to 325° C., preferably ranging from 120 to 200° C. In one embodiment, an alloyed nanostructure has a wider bandgap than the InP nanostructure. It is expected that such an alloy will have a reduced FWHM that is useful for green-emitting, Cd-free quantum dots.

In some embodiments, the layers are synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Application Publication No. 2008/0118755.

In some embodiments, ligands suitable for the synthesis of shell layers are known by those of skill in the art. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from the group consisting of dodecylamine, oleylamine, hexadecylamine, and octadecylamine. In some embodiments, the ligand is trioctylphosphine (TOP). In some embodiments, the ligand is oleylamine. In one embodiment, the ligand is diphenylphosphine.

Production of Further Shell Layers on InP/GaP and InP/AlP Shell

In some embodiments, further shell layers are produced by adding additional shell precursors followed by maintaining at an elevated temperature. Typically, additional precursor is provided after reaction of the previous layer is substantially complete (e.g., when at least one of the previous precursors is depleted or removed from the reaction or when no additional growth is detectable). In other embodiments, the InP/GaP or InP/AlP nanostructures are isolated, and then further shell layer(s) are added in one or more separate reactions.

In some embodiments, the second shell is selected from the group consisting of CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AlN, AlSb, AlS, PbS, PbO, PbSe, PbTe, MgO, MgS, MgSe, MgTe, CuCl, Ge, Si and alloys thereof. In one embodiment, the second shell comprises ZnS.

In some embodiments, the process comprises contacting the InP core surrounded by the first GaP or AlP shell with a source of zinc and a source of sulfur in a solvent. In some embodiments, the sulfur source is selected from elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof. In some embodiments, the sulfur source is an alkyl-substituted zinc dithiocarbamate. In one embodiment, the source of sulfur is an alkyl mercaptan. In one particular embodiment, the alkyl mercaptan is octane-1-thiol.

In some embodiments, the source of zinc is selected from the group consisting of zinc oleate, zinc hexanoate, zinc octanoate, zinc laurate, zinc palmitate, zinc stearate, zinc dithiocarbamate, or mixtures thereof. In one embodiment, the source of zinc is a zinc dicarboxylate. In one specific embodiment, the zinc dicarboxylate is zinc dioleate.

In one embodiment, the solvent is TOP, which also functions as a ligand for the nanostructure. In another embodiment, the solvent is selected from the group consisting of 1-octadecene, 1-hexadecene, 1-eicosene, eicosane, octadecane, hexadecane, tetradecane, squalene, trioctylphosphine oxide, and dioctyl ether. In another embodiment, the solvent is an amine such as one selected from the group consisting of dodecylamine, oleylamine, hexadecylamine, and octadecylamine. In some embodiments, the solvent is 1-octadecene.

In some embodiments, the reaction is carried out at a temperature between about 200° C. and about 350° C. for a time of about 30 minutes to 3 hours. In a particular embodiment, the reaction is carried out at about 230° C. for about 2 hours.

After sufficient shell layers have been added for the nanostructure to reach the desired thickness and diameter, the nanostructure is cooled. In some embodiments, the InP/GaP/shell or InP/AlP/shell nanostructures are cooled to room temperature. In some embodiments, an organic solvent is added to dilute the reaction mixture comprising the InP/GaP/shell or InP/AlP/shell nanostructures.

In some embodiments, the organic solvent used to dilute the reaction mixture is ethanol, hexane, pentane, toluene, benzene, diethylether, acetone, ethyl acetate, dichloromethane (methylene chloride), chloroform, dimethylformamide, or N-methylpyrrolidinone. In some embodiments, the organic solvent is toluene.

In some embodiments, InP/GaP/shell or InP/AlP/shell nanostructures are isolated. In some embodiments, the InP/GaP/shell or InP/AlP/shell nanostructures are isolated by precipitation using an organic solvent, e.g., a polar solvent such as acetone or an alcohol such as methanol. The precipitated solid may then be washed with the polar solvent, then taken up in a non-polar solvent, and reprecipitated with a polar solvent. This process may be repeated. The nanostructure may further be isolated by filtration and washed with a polar solvent. In one embodiment, the InP/GaP/shell or InP/AlP/shell nanostructures are isolated by flocculation with acetone or ethanol.

The number of layers will determine the size of the InP/GaP/shell or InP/AlP/shell nanostructures. The size of the InP/GaP/shell or InP/AlP/shell nanostructures can be determined using techniques known to those of skill in the art. In some embodiments, the size of the InP/GaP/shell or InP/AlP/shell nanostructures is determined using TEM. In some embodiments, the InP/GaP/shell or InP/AlP/shell nanostructures have an average diameter of between 1 nm and 15 nm, between 1 nm and 10 nm, between 1 nm and 9 nm, between 1 nm and 8 nm, between 1 nm and 7 nm, between 1 nm and 6 nm, between 1 nm and 5 nm, between 5 nm and 15 nm, between 5 nm and 10 nm, between 5 nm and 9 nm, between 5 nm and 8 nm, between 5 nm and 7 nm, between 5 nm and 6 nm, between 6 nm and 15 nm, between 6 nm and 10 nm, between 6 nm and 9 nm, between 6 nm and 8 nm, between 6 nm and 7 nm, between 7 nm and 15 nm, between 7 nm and 10 nm, between 7 nm and 9 nm, between 7 nm and 8 nm, between 8 nm and 15 nm, between 8 nm and 10 nm, between about 8 nm and 9 nm, between 9 nm and 15 nm, between 9 nm and 10 nm, or between 10 nm and 15 nm. In some embodiments, the InP/GaP/shell or InP/AlP/shell nanostructures have an average diameter of between 6 nm and 7 nm.

In some embodiments, the diameter of the InP/GaP/shell or InP/AlP/shell nanostructures is determined using quantum confinement. Quantum confinement in zero-dimensional nanocrystallites, such as quantum dots, arises from the spatial confinement of electrons within the crystallite boundary. Quantum confinement can be observed once the diameter of the material is of the same magnitude as the de Broglie wavelength of the wave function. The electronic and optical properties of nanoparticles deviate substantially from those of bulk materials. A particle behaves as if it were free when the confining dimension is large compared to the wavelength of the particle. During this state, the bandgap remains at its original energy due to a continuous energy state. However, as the confining dimension decreases and reaches a certain limit, typically in nanoscale, the energy spectrum becomes discrete. As a result, the bandgap becomes size-dependent. This ultimately results in a blue-shift in light emission as the size of the particles decreases.

In some embodiments, the InP/GaP/shell or InP/AlP/shell nanostructures display a high photoluminescence quantum yield. In some embodiments, the InP/GaP/shell or InP/AlP/shell nanostructures display a photoluminescence quantum yield of between 20% and 90%, between 20% and 80%, between 20% and 70%, between 20% and 60%, between 20% and 50%, between 20% and 40%, between 20% and 30%, between 30% and 90%, between 30% and 80%, between 30% and 70%, between 30% and 60%, between 30% and 50%, between 30% and 40%, between 40% to 90%, between 40% and 80%, between 40% and 70%, between 40% and 60%, between 40% and 50%, between 50% and 90%, between 50% and 80%, between 50% and 70%, between 50% and 60%, between 60% to 90%, between 60% and 80%, between 60% and 70%, between 70% to 90%, between 70% and 80%, or between 80% and 90%.

The photoluminescence spectrum of the InP/GaP/shell or InP/AlP/shell nanostructures can cover essentially any desired portion of the spectrum. In some embodiments, the photoluminescence spectrum for the InP/GaP/shell or InP/AlP/shell nanostructures have a emission maximum between 300 nm and 750 nm, between 300 nm and 650 nm, between 300 nm and 550 nm, between 300 nm and 450 nm, between 450 nm and 750 nm, between 450 nm and 650 nm, between 450 nm and 550 nm, between 550 nm and 750 nm, between 550 nm and 650 nm, between 550 nm and 750 nm, between 550 nm and 650 nm, or between 650 nm and 750 nm. In some embodiments, the photoluminescence spectrum for the InP/GaP/shell or InP/AlP/shell nanostructures has an emission maximum of between 450 nm and 550 nm. In some embodiments, the InP/GaP/shell or InP/AlP/shell nanostructures have an emission maximum between 445-485 nm (blue), between 505-540 nm (green) or between 610-650 nm (red).

The size distribution of the InP/GaP/shell or InP/AlP/shell nanostructures can be relatively narrow. In some embodiments, the photoluminescence spectrum of the population can have a full width at half maximum of between 10 nm and 60 nm, between 10 nm and 40 nm, between 10 nm and 30 nm, between 10 nm and 20 nm, between 20 nm and 60 nm, between 20 nm and 40 nm, between 20 nm and 30 nm, between 30 nm and 60 nm, between 30 nm and 40 nm, or between 40 nm and 60 nm.

In some embodiments, at least one of the shell layers is doped with a metal. In some embodiments, at least one of the shell layers is doped with a metal selected from the group consisting of Mg, Ca, and Te.

In some embodiments, the InP/GaP or InP/AlP nanostructure is subjected to an acid etching step before deposition of a shell layer.

In some embodiments, the nanostructures include a ZnS shell layer. The shell can, e.g., increase the quantum yield and/or stability of the nanostructures. The core is generally synthesized first, optionally enriched, and then additional precursors from which the shell (or a layer thereof) is produced are provided. In some embodiments, the nanostructures of the present invention include a core, a GaP or AlP layer, and a ZnS shell layer.

Synthesis of a InP/GaP/ZnS or InP/AlP/ZnS nanostructure in at least three discrete steps provides a greater degree of control over the thickness of the resulting layers. And, synthesis of the core and each shell layer in different steps also provides greater flexibility, for example, in the ability to employ different solvent and ligand systems in the core and shell synthesis. Multi-step synthesis techniques can thus facilitate production of nanostructures with narrow size distribution (i.e., having a small FWHM) and high quantum yield.

In some embodiments, the ZnS shell passivates defects at the particle surface, which leads to an improvement in the quantum yield and to higher device efficiencies. Furthermore, spectral impurities which are caused by defect states may be eliminated by passivation, which increases the color saturation.

In some embodiments, the ZnS shell comprises more than one layer of ZnS. The number of shell layers is an average for all the nanostructures; therefore, the number of shell layers may be a fraction. In some embodiments, the number of ZnS layers in the ZnS shell is between 2 and 20, between 2 and 15, between 2 and 10, between 2 and 9, between 2 and 8, between 2 and 7, between 2 and 6, between 2 and 5, between 2 and 4, between 2 and 3, between 3 and 20, between 3 and 15, between 3 and 10, between 3 and 9, between 3 and 8, between 3 and 7, between 3 and 6, between 3 and 5, between 3 and 4, between 4 and 20, between 4 and 15, between 4 and 10, between 4 and 9, between 4 and 8, between 4 and 7, between 4 and 6, between 4 and 5, between 5 and 20, between 5 and 15, between 5 and 10, between 5 and 9, between 5 and 8, between 5 and 7, between 5 and 6, between 6 and 20, between 6 and 15, between 6 and 10, between 6 and 9, between 6 and 8, between 6 and 7, between 7 and 20, between 7 and 15, between 7 and 10, between 7 and 9, between 7 and 8, between 8 and 20, between 8 and 15, between 8 and 10, between 8 and 9, between 9 and 20, between 9 and 15, between 9 and 10, between 10 and 20, between 10 and 15, or between 15 and 20. In some embodiments, the ZnS shell comprises 4.5 layers of ZnS.

The thickness of the ZnS shell layers can be controlled by varying the amount of precursor provided and/or the time of reaction. For a given layer, at least one of the precursors is optionally provided in an amount whereby, when a growth reaction is substantially complete, the layer is of a predetermined thickness. If more than one different precursor is provided, either the amount of each precursor can be so limited or one of the precursors can be provided in a limiting amount while the others are provided in excess.

The thickness of each ZnS layer of the ZnS shell can be determined using techniques known to those of skill in the art. In some embodiments, the thickness of each layer is determined by comparing the diameter of the InP/GaP/ZnS or InP/AlP/ZnS nanostructure before and after the addition of each layer. In some embodiments, the diameter of the InP/GaP/ZnS or InP/AlP/ZnS nanostructure before and after the addition of each layer is determined by TEM. In some embodiments, each ZnS layer has a thickness of between 0.05 nm and 3 nm, between 0.05 nm and 1 nm, between 0.05 nm and 0.5 nm, between 0.05 nm and 0.3 nm, between 0.05 nm and 0.1 nm, between 0.1 nm and 2 nm, between 0.1 nm and 1 nm, between 0.1 nm and 0.5 nm, between 0.1 nm and 0.3 nm, between 0.3 nm and 2 nm, between 0.3 nm and 1 nm, between 0.3 nm and 0.5 nm, between 0.5 nm and 2 nm, between 0.05 nm and 1 nm, between 1 nm and 2 nm, or between 2 nm and 3 nm. In some embodiments, each ZnS layer has an average thickness of about 0.62 nm.

In one embodiment, a first set of one or more precursors are provided in an amount and the precursors are reacted to produce a first layer on the shell whereby, when the reaction is substantially complete, the first layer has a thickness of between about 0.3 nm and about 1.0 nm of ZnS. Typically, this thickness is calculated assuming that precursor conversion is 100% efficient. A shell can but need not completely cover the underlying material. Without limitation to any particular mechanism and purely for the sake of example, where the first layer of the shell is about 0.5 layer of ZnS thick, the core can be covered with small islands of ZnS or about 50% of the cationic sites and 50% of the anionic sites can be occupied by the shell material. Similarly, in one class of embodiments providing a second set of one or more precursors and reacting the precursors to produce a second layer of the shell comprises providing the one or more precursors in an amount whereby, when the reaction is substantially complete, the second layer is between about 1 and about 4 layers of ZnS thick or between about 0.3 nm and about 1.2 nm thick.

In some embodiments, the shell layers are synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties.

In some embodiments, ligands suitable for the synthesis of shell layers, including ZnS shell layers, are known by those of skill in the art. In some embodiments, the ligand is a fatty acid selected from the group consisting of lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from the group consisting of dodecylamine, oleylamine, hexadecylamine, and octadecylamine. In some embodiments, the ligand is trioctylphosphine (TOP). In some embodiments, the ligand is oleylamine. In some embodiments, the ligand is lauric acid.

In some embodiments, the shell is produced in the presence of a mixture of ligands. In some embodiments, the shell is produced in the presence of a mixture comprising 2, 3, 4, 5, or 6 different ligands. In some embodiments, the shell is produced in the presence of a mixture comprising 2 different ligands. In one embodiment, the mixture of ligands comprises TOP and TOPO. In another embodiment, the mixture of ligands comprises TOP, TOPO, oleylate and laureate. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Application Publication No. 2008/0118755.

After the InP/GaP/shell nanostructures or InP/AlP/shell nanostructures reach the desired thickness and diameter, they are cooled. In some embodiments, the InP/GaP/shell nanostructures or InP/AlP/shell nanostructures nanostructures are cooled to room temperature. In some embodiments, an organic solvent is added to dilute the reaction mixture comprising the InP/GaP/shell nanostructures or InP/AlP/shell nanostructures.

In some embodiments, the organic solvent is hexane, pentane, toluene, benzene, diethylether, acetone, ethyl acetate, dichloromethane (methylene chloride), chloroform, dimethylformamide, methanol, ethanol, or N-methylpyrrolidinone. In some embodiments, the organic solvent is toluene.

Films, Devices and Uses

A population of InP/GaP/shell nanostructures or InP/AlP/shell nanostructures are optionally embedded in a matrix that forms a film (e.g., an organic polymer, silicon-containing polymer, inorganic, glassy, and/or other matrix). This film may be used in production of a nanostructure phosphor, and/or incorporated into a device, e.g., an LED, backlight, downlight, or other display or lighting unit or an optical filter. Exemplary phosphors and lighting units can, e.g., generate a specific color light by incorporating a population of nanostructures with an emission maximum at or near the desired wavelength or a wide color gamut by incorporating two or more different populations of nanostructures having different emission maxima. A variety of suitable matrices are known in the art. See, e.g., U.S. Pat. No. 7,068,898 and U.S. Patent Application Publication Nos. 2010/0276638, 2007/0034833, and 2012/0113672. Exemplary nanostructure phosphor films, LEDs, backlighting units, etc. are described, e.g., in U.S. Patent Application Publications Nos. 2010/0276638, 2012/0113672, 2008/0237540, 2010/0110728, and 2010/0155749 and U.S. Pat. Nos. 7,374,807, 7,645,397, 6,501,091, and 6,803,719.

The invention also provides a display device comprising:
(a) a layer that emits radiation;
(b) a film layer comprising a population of InP/GaP/shell nanostructures or InP/AlP/shell nanostructures, disposed on the radiation emitting layer;
(c) an optically transparent barrier layer on the film layer; and
(d) an optical element, disposed on the barrier layer.

In one embodiment, the radiation emitting layer, the film layer, and the optical element are part of a pixel unit of the display device. In another embodiment, the optical element is a color filter. In another embodiment, the barrier layer comprises an oxide. In another embodiment, the film layer further comprises surfactants or ligands bonded to the optically transparent barrier layer. In another embodiment, the optically transparent barrier layer is configured to protect the nanostructure from degradation by light flux, heat, oxygen, moisture, or a combination thereof.

The InP/GaP/shell nanostructures or InP/AlP/shell nanostructures can be used for imaging or labeling, e.g., biological imaging or labeling. Thus, the InP/GaP/shell nanostructures or InP/AlP/shell nanostructures are optionally covalently or noncovalently bound to biomolecule(s), including, but not limited to, a peptide or protein (e.g., an antibody or antibody domain, avidin, streptavidin, neutravidin, or other binding or recognition molecule), a ligand (e.g., biotin), a polynucleotide (e.g., a short oligonucleotide or longer nucleic acid), a carbohydrate, or a lipid (e.g., a phospholipid or other micelle). One or more core/buffer layer/shell nanostructures can be bound to each biomolecule, as desired for a given application. Such core/buffer layer/shell nanostructure-labeled biomolecules find use, for example, in vitro, in vivo, and in cellulo, e.g., in exploration of binding or chemical reactions as well as in subcellular, cellular, and organismal labeling.

InP/GaP/shell nanostructures or InP/AlP/shell nanostructures resulting from the methods are also a feature of the invention. Thus, one class of embodiments provides a population of InP/GaP/shell nanostructures or InP/AlP/shell nanostructures. In some embodiments, the InP/GaP/shell nanostructures or InP/AlP/shell nanostructures nanostructures are quantum dots.

EXAMPLES

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

The following sets forth a series of examples that demonstrate the preparation of highly luminescent nanostructures.

Example 1

Formation of InP/GaP. To a solution of $GaCl_3$ (90 mg, 0.51 mmol) dissolved in 3 mL TOP at 120° C. was added InP core (140 mg, 0.96 mmol) dissolved in 1.7 mL hexane, and the flask was briefly vented to allow hexane to boil out of the TOP solution. An aliquot taken from the reaction mixture showed that the absorption of the core shifted by 5 nm from 475 to 481 nm at this temperature. The mixture was held at 120° C. for 1 hour before cooling to ambient temperature.

The product had an absorption peak at 481 nm. A portion of this solution was dried under a dynamic vacuum and submitted for ICP-AES analysis and shown as mole fraction values in Table 3 Example 1. ICP-AES (as weight percent): Zn, 0.37; S, not detected; P, 9.00; In, 3155; Ga, 4.89.

Example 2

Formation of InP/GaP: To 3 mL of TOP was added a solution of InP core (171 mg, 1.17 mmol) in 2 mL hexane at 105° C., and the flask was briefly vented to allow hexane to boil out of the TOP solution. The solution was heated to 125° C. at which temperature $GaCl_3$ was added as a solid. The solution was held at 125° C. for 20 min then heated to 150° C. at which temperature a solution of $P(SiMe_3)_3$ (120 mg, 0.47 mmol) in 0.75 mL TOP was added over 5 min. The so obtained mixture was stirred at 150° C. for 20 min before the temperature was raised to 200° C. and held at that temperature for an additional 20 min. After this time, the mixture was allowed to cool to ambient temperature.

The addition of acetone to the cooled reaction mixture precipitated orange solids, and the remaining solution was discarded. The solids were washed twice with acetone before being extracted into hexane. The hexane extracts were passed through a 0.45 micron filter to obtain the product as a hexane solution.

The product had an absorption peak at 494.5 nm (for comparison, the starting InP core was 475 nm). A TEM image was acquired (FIG. 1). A portion of this solution was analyzed by ICP-AES analysis. ICP-AES (as weight percent): Zn, 0.037; S, not detected; P, 0.493; In, 1.932; Ga, 0.2229. Table 3 Example 2 shows the same data in mole fractions.

Example 3

Formation of InP/GaP/ZnS: To a solution of $GaCl_3$ (90 mg, 0.51 mmol) dissolved in 3 mL TOP at 120° C. was added InP core (140 mg, 0.96 mmol) dissolved in 1.7 mL, hexane, and the flask was briefly vented to allow hexane to boil out of the TOP solution. An aliquot taken from the reaction mixture showed that the absorption of the core had shifted by 5 nm from 475 to 480 nm at this temperature. The mixture was then slowly heated to 150° C. with no change in the absorption spectrum, and then to 200° C. at which temperature the absorption band shifted to 490 nm. At 200° C., a solution of $P(SiMe_3)_3$ (600 mg, 0.48 mmol) in 1 mL of TOP was added to the reaction mixture which was held at 200° C. for 20 min. This resulted in an additional 10 nm red-shift of the absorption band to 499 nm. (In total, a 24 nm red-shift of the absorption band was observed during GaP shell growth.)

The reaction mixture was cooled to 150° C. and transferred into a flask containing $Zn(oleate)_2$ (8 g, 11.7 mmol) in 50 mL of octadecene at 150° C. Octanethiol (1.67 g, 11.5 mmol) was added and the combined mixture was heated to 310° C. and held at this temperature for 2 hours. After cooling to ambient temperature, the product was precipitated from the reaction mixture by the addition of EtOH. The solvents were carefully decanted away from this precipitate and the remaining solids were washed with acetone. The solids were then extracted into hexane and filtered through a 0.45 micron filter.

The product had an absorption peak at 502 nm and emitted at 552 nm with a photoluminescent quantum yield of 66%. A portion of this solution was dried under a dynamic vacuum and submitted for ICP-AES analysis, shown in Table 3 Example 3 in mole fraction values. ICP-AES (as weight percent): Zn, 16.15; S, 6.12; P, 0.89; In, 3.10; Ga, 0.56.

Example 4

Figure 2:
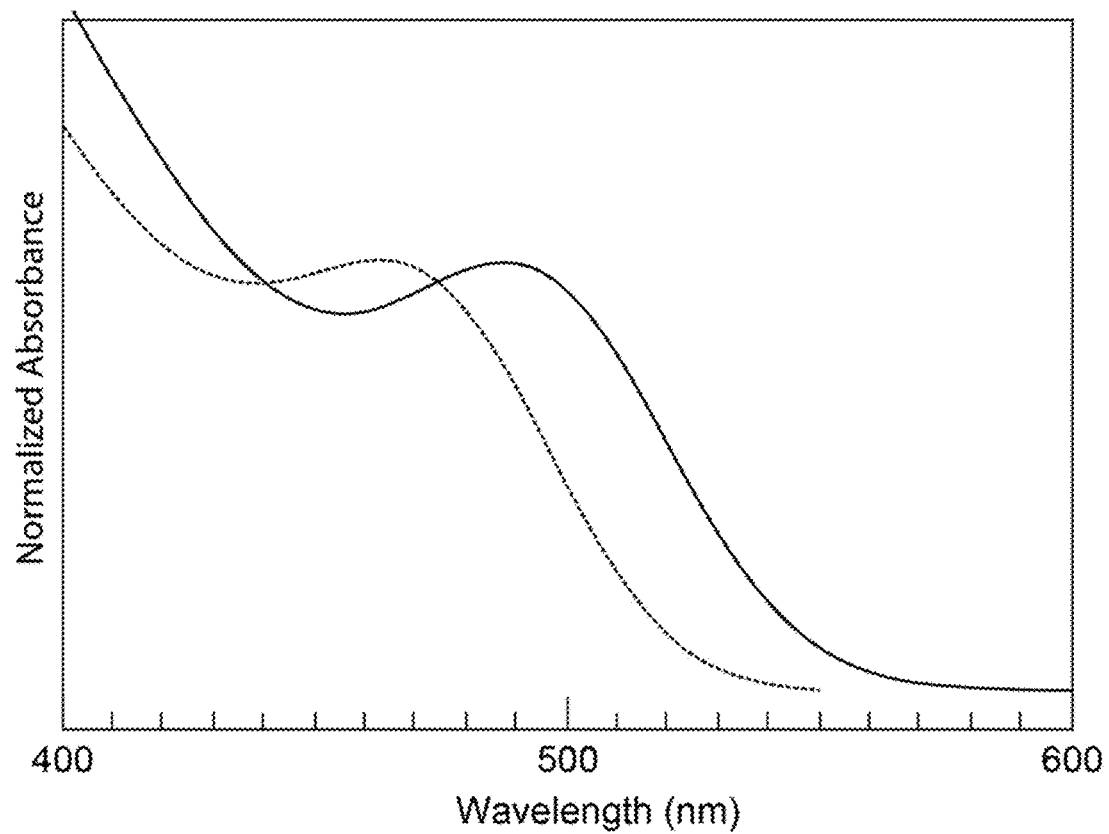
FIG. 2 is a UV-vis spectra of the InP nanocrystal starting material (dashed line) and the resulting InP/AlP nanocrystal following treatment of InP with $AlCl_3$ in TOP at 150° C. (solid line) corresponding to Example 4.

Formation of InP/AlP: To 3 mL of TOP was added a solution of InP core (171 mg, 1.17 mmol) in 2 mL hexane at 110° C., and the flask was briefly vented to allow hexane to boil out of the TOP solution. Then at the same temperature, $AlCl_3$ was added as a solid. After the addition of $AlCl_3$, the local absorbance in the UV-vis shifted by 8.5 nm (from 475 nm to 487.5 nm) and the solution spontaneously warmed to 115° C. This temperature was maintained for 20 min before the mixture was heated to 150° C. for an additional 20 min. After this time, the mixture was allowed to cool to ambient temperature. UV-vis spectra indicated that the InP/AlP nanocrystal had an absorbance maximum at 487 nm. The change in the UV-vis spectrum during this reaction is shown in FIG. 2.

Example 5

Formation of InP/AlP/ZnS: To a solution of $AlCl_3$ (90 mg, 0.51 mmol) dissolved in 5 mL TOP at 110° C. was added InP core (140 mg, 0.96 mmol) dissolved in 3 mL of TOP. An aliquot taken from the reaction mixture showed that the absorption of the nanocrystals shifted by 14 nm from 475 to 489 nm at this temperature. The mixture was then slowly heated to 150° C. with no change in the absorption spectrum. Then, at 150° C., a solution of $P(SiMe_3)_3$ (600 mg, 0.48 mmol) in 1 mL of TOP was added to the reaction mixture with no additional red-shift of the absorption spectrum. The mixture was subsequently heated to 200° C. for 20 min, again with no change to the absorbance band.

The reaction mixture was cooled to 125° C. and transferred into a flask containing $Zn(oleate)_2$ (8 g, 11.7 mmol) in 50 mL of octadecene at 150° C. Octanethiol (1.67 g, 11.5 mmol) was added and the combined mixture was heated to 310° C. and held at this temperature for 2.5 hours. After cooling to ambient temperature, the product was precipitated from the reaction mixture by the addition of EtOH. The solvents were carefully decanted away from this precipitate and the remaining solids were washed with acetone. The solids were then extracted into hexane and filtered through a 0.45 micron filter.

The product had an absorption peak at 505 nm and emitted at 555 nm with a photoluminescent quantum yield of 55%. A portion of this solution was dried under a dynamic vacuum and submitted for ICP-AES analysis (shown in Table 3 Example 5 of the mole fraction values). ICP-AES (as weight percent): Zn, 13.97; S, 5.88; P, 0.83; In, 2.90; Al, 0.11.

Example 6

Figure 3:
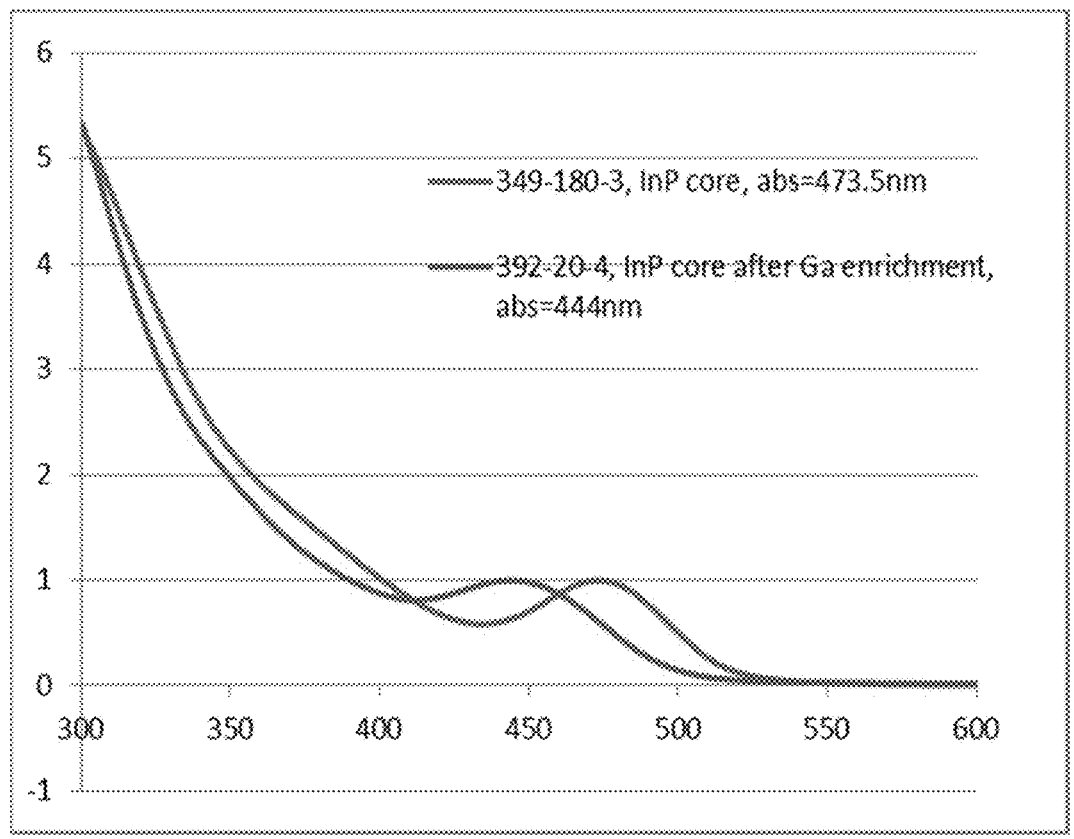
FIG. 3 is a UV-vis spectrum of InP nanocrystals treated with gallium laurate according to Example 6.

Attempted $Ga^{3+}$ Doping with Gallium Laureate: 500 mg InP core (with the abs at 473.5 nm), 2.3 g of Gallium laurate (prepared by the reaction of trimethyl gallium with lauric acid) and 30 mL ODE were loaded into 250 mL flask. The reaction mixture was heated to 280° C. for 40 min. During that period there was a 29.5 nm blue shift of the InP core from 473.5 to 444 nm. (FIG. 3). The reaction mixture was analyzed by ICP-AES and the results indicated that gallium had not been incorporated into the core. ICP-AES (wt %): Zn, 0.09%; P, 0.22%; In, 2.07%; Ga, not detected.

Example 7

Figure 4:
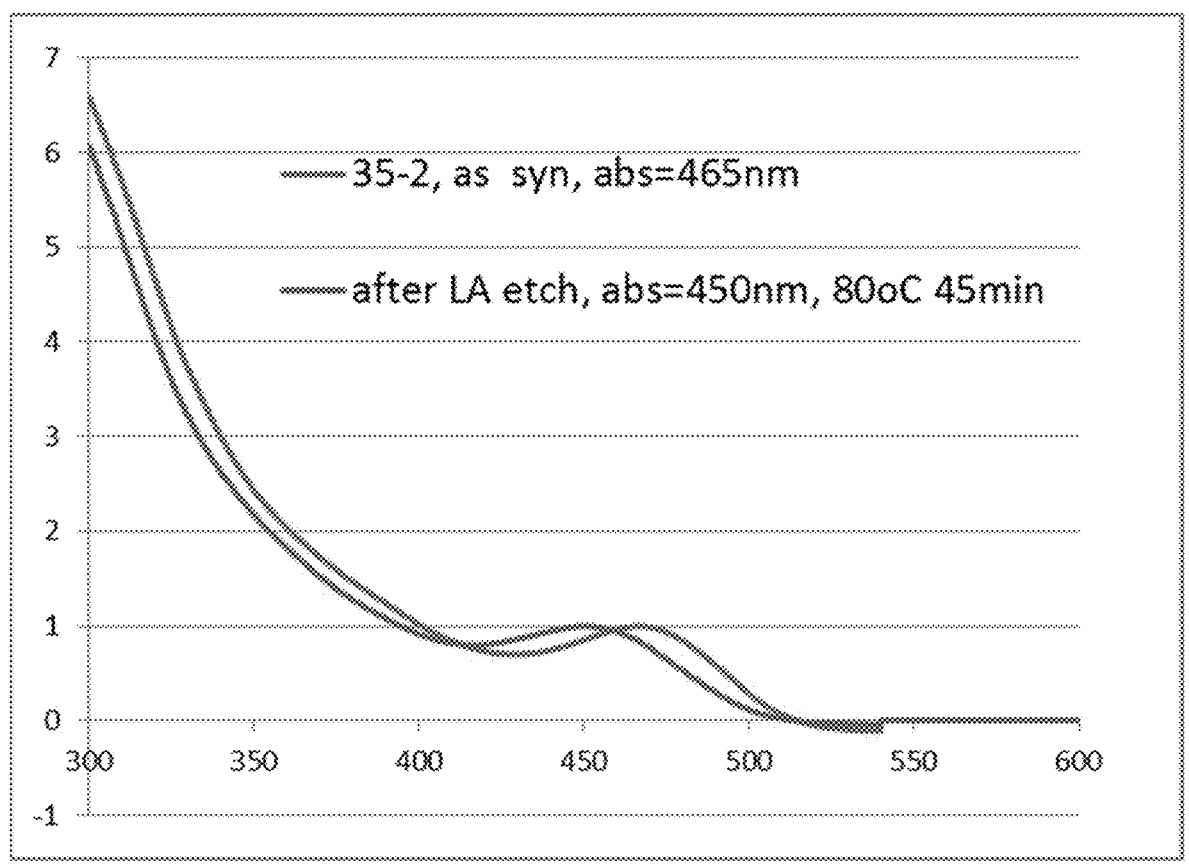
FIG. 4 is a UV-vis spectrum of InP nanocrystals treated with lauric acid according to Example 7.

Control Experiment Using Laurie Acid Only: The procedure of Example 5 was repeated using only lauric acid and not gallium laureate. This resulted in a blue-shift of the absorption by 15 nm. (FIG. 4).

Example 8

Control Experiment Using Oleic Acid Only: At 80° C., oleic acid was added to an InP core dissolved in ODE. During the next 10 minutes, the absorption peak blue-shifted from 465 nm to 458 nm, or a total of 7 nm.

Example 9

An attempt was made to repeat a literature report using gallium trichloride and oleic acid (Kim et al., *J. Am. Chem. Soc.* 134: 3804-3809 (2012).

A 100 mL, 3-neck, round-bottom flask was loaded with $GaCl_3$ (90 mg, 0.51 mmol) in an inert atmosphere glovebox. To the flask was added InP nanocrystals (0.15 g, 1 mmol), oleic acid (0.48 g, 1.7 mmol), and octadecene (5 mL). The mixture was heated to 40° C. under a dynamic vacuum to degas the mixture. The InP nanocrystals had an absorption maximum at 455 nm.

The mixture was heated to 200° C. for 60 min. During this time the absorption band became very broad and was shifted to 480 nm. Then, $Zn(OAc)_2$ (1.56 g, 8.5 mmol) was added and the mixture heated to 230° C. before dodecanethiol (1.0 g, 4.94 mmol) was added. The reaction was kept at 230° C. for 2 hours before it was allowed to cool to ambient temperature.

The cooled reaction mixture was diluted with 12 mL of hexanes and centrifuged to remove solids that formed during the reaction. The solution was then separated from the solids that were discarded. The solution had a broad absorption at 480 nm and emitted at 552 nm (FWHM=98 nm) with a photoluminescent quantum yield of 78%.

Example 10

Attempt to Repeat Literature Report Using Only Oleic Acid: The purpose of this experiment was to determine if gallium was required to reproduce the literature report by Kim et al., *J. Am. Chem. Soc.* 134: 3804-3809 (2012). The same procedure used was followed, but in the absence of any source of gallium.

A 100 mL, 3-neck, round-bottom flask was loaded with octadecene (5 L) before adding InP nanocrystals (0.15 g, 1 mmol). The mixture was warmed to 60° C. under a dynamic vacuum to remove the hexane. The mixture was heated to 200° C. before oleic acid (0.48 g, 1.7 mmol) was added. The absorption band quickly broadened and shifted to ca. 500 nm (a 25 nm red-shift) after the addition of oleic acid. After 5 minutes, $Zn(OAc)_2$ (1.56 g, 8.5 mmol) and dodecanethiol (1.0 g, 4.94 mmol) were added before the mixture was heated to 230° C. for 2 hours.

The cooled reaction mixture was diluted with 12 mL of hexanes and centrifuged to remove solids that formed during the reaction. The solution was then separated from the solids that were discarded. The solution had a broad absorption at ca. 480 nm and emitted at 550 nm (FWHM=69 nm) with a photoluminescent quantum yield of 79%.

Having now fully described this invention, it will be understood by those of ordinary skill in the art that the same can be performed within a wide and equivalent range of conditions, formulations and other parameters without affecting the scope of the invention or any embodiment thereof. All patents, patent applications, and publications cited herein are fully incorporated by reference herein in their entirety.

What is claimed is:

1. A nanostructure comprising an InP core and a first GaP or AlP shell, further comprising an alloy between the InP core and the first GaP or AlP shell.

2. The nanostructure of claim 1, further comprising a second shell surrounding the first GaP or AlP shell.

3. The nanostructure of claim 2, wherein the second shell is selected from the group consisting of CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AlN, AlSb, AlS, PbS, PbO, PbSe, PbTe, MgO, MgS, MgSe, MgTe, CuCl, Ge, Si and alloys thereof.

4. The nanostructure of claim 1, comprising a first GaP shell and further surrounded by a ZnS shell.

5. A nanostructure comprising an InP core and a first AlP shell and further surrounded by a ZnS shell.

6. A film comprising a matrix and a population of nanostructures of claim 1.

7. The nanostructure of claim 1, comprising a first AlP shell and further surrounded by a ZnS shell.

8. A film comprising a matrix and a population of nanostructures of claim 5.

* * * * *